United States Patent
Kajiya et al.

(10) Patent No.: US 9,484,708 B2
(45) Date of Patent: Nov. 1, 2016

(54) DUAL WAVELENGTH LASER MODULE WITH CONSTANT OUTPUT INTENSITY

(71) Applicant: Mitsubishi Electric Corporation, Tokyo (JP)

(72) Inventors: Satoshi Kajiya, Tokyo (JP); Tetsuhiro Fukao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/886,447

(22) Filed: Oct. 19, 2015

(65) Prior Publication Data

US 2016/0204568 A1 Jul. 14, 2016

(30) Foreign Application Priority Data

Jan. 9, 2015 (JP) .................... 2015-002770

(51) Int. Cl.
*H01S 5/10* (2006.01)
*H01S 5/40* (2006.01)
*H01S 3/10* (2006.01)
*H04B 10/50* (2013.01)

(52) U.S. Cl.
CPC ......... *H01S 3/10015* (2013.01); *H01S 5/4087* (2013.01); *H04B 10/503* (2013.01)

(58) Field of Classification Search
CPC ........ H01S 5/042; H01S 5/0427; H01S 5/40; H01S 5/4012; H01S 5/4087; H01S 3/10015
See application file for complete search history.

(56) References Cited

U.S. PATENT DOCUMENTS

2012/0087655 A1* 4/2012 Neilson .................... G02B 5/20
398/34
2013/0223459 A1* 8/2013 Radic ........................ H01S 3/13
372/20

FOREIGN PATENT DOCUMENTS

| JP | H04-118637 | 4/1992 |
| JP | 2006-261590 | 9/2006 |
| JP | 2011-108894 | 6/2011 |
| JP | 2012-124287 | 6/2012 |

OTHER PUBLICATIONS

L E. Nelson et al., "Performance of a 46-Gbps Dual-Polarization QPSK Transceiver With Real-Time Coherent Equalization Over High PMD Fiber," Journal of Lightwave Technology, vol. 27, No. 3 (2009).

* cited by examiner

*Primary Examiner* — Eric Bolda
(74) *Attorney, Agent, or Firm* — Studebaker & Brackett PC

(57) ABSTRACT

A laser module includes a light source device having a first amplifier that outputs first output light, and a second amplifier that outputs second output light, a first drive circuit that supplies the first amplifier with a first drive current, a second drive circuit that supplies the second amplifier with a second drive current. A dither signal is superimposed on one of two drive currents to respectively grasp the characteristics of the two amplifiers.

10 Claims, 4 Drawing Sheets

DUAL WAVELENGTH LASER MODULE WITH CONSTANT OUTPUT INTENSITY

BACKGROUND OF THE INVENTION

1. Field of the Invention

The present invention relates to a laser module for use, for example, as a light source in a wavelength division multiplexing (WDM) communication system.

2. Background Art

Japanese Patent Laid-Open No. 2012-124287 discloses a laser module that outputs laser light of a desired wavelength. Laser modules of a wavelength variable type are being widely used as light sources for WDM communication systems. Digital coherent optical communication as a communication system is in the mainstream. A document: L. E. Nelson, et al., "Performance of a 46-Gbps Dual-Polarization QPSK Transceiver With Real-Time Coherent Equalization Over High PMD Fiber", IEEE JOURNAL OF LIGHTWAVE TECHNOLOGY, VOL. 27, NO. 3, Feb. 1, 2009, discloses incorporation of two light sources in one optical transceiver because of the need for transmission light and local light in coherent optical communication.

Incorporation of an optical amplifier for transmission light and an optical amplifier for local light in a laser module for the purpose of achieving reductions in size and cost is conceivable. It is preferable that each of the intensities of output lights from the two optical amplifiers be controlled so as to be constant and not to change with respect to time. From the viewpoint of controlling each of the intensities of output lights from the two optical amplifiers so that the intensity of light is constant, it is preferable to separate transmission light and local light in the laser module and to receive each light with a photodiode. More specifically, two photodiodes and two optical output monitoring circuits for monitoring the intensities of light detected with the photodiodes are provided. However, there is a problem that because of restrictions on the optical system it is impossible to provide two photodiodes and two optical output monitoring circuits.

SUMMARY OF THE INVENTION

In view of the above-described problem, an object of the present invention is to provide a laser module capable of making constant each of optical outputs from two optical amplifiers with a simple arrangement.

The features and advantages of the present invention may be summarized as follows.

According to one aspect of the present invention, a laser module includes a light source device having a first amplifier that outputs first output light, and a second amplifier that outputs second output light, a first drive circuit that supplies the first amplifier with a first drive current on which a dither signal is superimposed, a first monitoring circuit that detects the current supplied to the first amplifier, a second drive circuit that supplies the second amplifier with a second drive current, a second monitoring circuit that detects the second drive current, a light receiving element that receives part of the first output light and the second output light, an optical output monitoring circuit that detects the intensity of the light received by the light receiving element, and a processing circuit that controls the first drive circuit and the second drive circuit.

The processing circuit obtains a correlation between the first drive current and the intensity of the first output light from the output from the first monitoring circuit and the output from the optical output monitoring circuit, computes from the correlation the first drive current by which the average of the first output light is made equal to a predetermined value, causes the computed first drive current to be supplied to the first drive circuit, and causes the second drive current to be supplied to the second drive circuit so that the average of the output from the optical output monitoring circuit is constant.

According to another aspect of the present invention, a laser module includes a light source device having a first amplifier that outputs first output light, and a second amplifier that outputs second output light, a first drive circuit that supplies the first amplifier with a first drive current, a first monitoring circuit that detects the current supplied to the first amplifier, a second drive circuit that supplies the second amplifier with a second drive current, a second monitoring circuit that detects the current supplied to the second amplifier, a light receiving element that receives part of the first output light and the second output light, an optical output monitoring circuit that detects the intensity of the light received by the light receiving element, and a processing circuit that controls the first drive circuit and the second drive circuit. The processing circuit causes a dither signal to be alternately superimposed on the first drive current and the second drive current, obtains a first correlation as a correlation between the first drive current and the intensity of the first output light from the output from the first monitoring circuit and the output from the optical output monitoring circuit when the dither signal is superimposed on the first drive current, obtains a second correlation as a correlation between the second drive current and the intensity of the second output light from the output from the second monitoring circuit and the output from the optical output monitoring circuit when the dither signal is superimposed on the second drive current, computes from the first correlation the first drive current by which the average of the first output light is made equal to a predetermined value, and causes the computed first drive current to be supplied to the first drive circuit, and computes from the second correlation the second drive current by which the average of the second output light is made equal to a predetermined value, and causes the computed second drive current to be supplied to the second drive circuit.

Other and further objects, features and advantages of the invention will appear more fully from the following description.

DETAILED DESCRIPTION OF THE PREFERRED EMBODIMENTS

Figure 1:
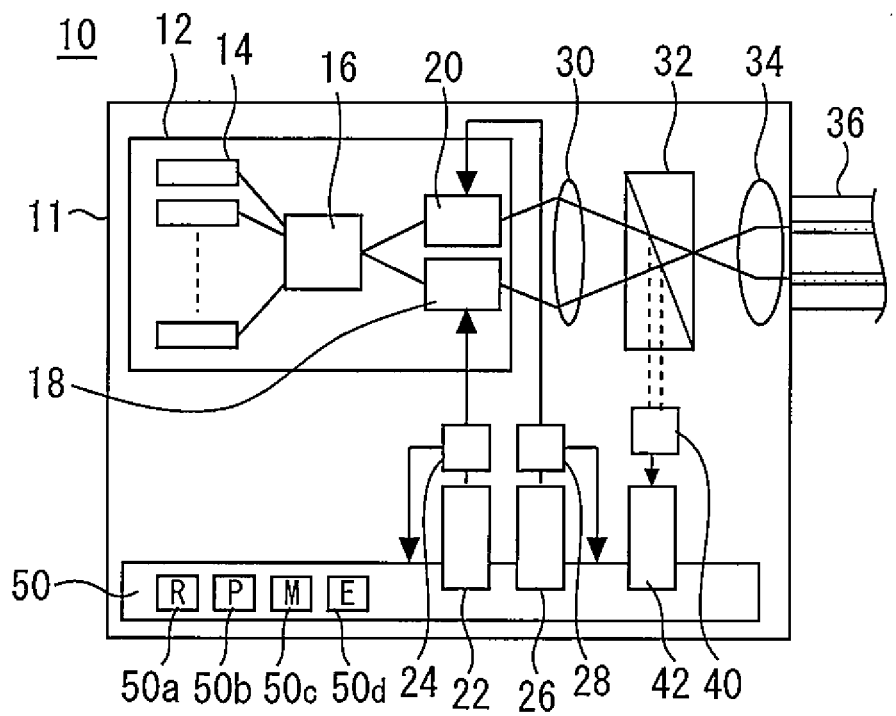
FIG. 1 is a plan view of a laser module according to a first embodiment.

A laser module according to an embodiment of the present invention will be described with reference to the drawings. Components identical or corresponding to each other are assigned the same reference characters and repeated description of them is avoided in some cases.

First Embodiment

FIG. 1 is a plan view of a laser module 10 according to a first embodiment of the present invention. The laser module 10 is provided with a light source device 12 provided in a package 11. The light source device 12 is provided with a plurality of semiconductor laser elements 14, an optical coupler 16, a first amplifier 18 and a second amplifier 20. The plurality of semiconductor laser elements 14 are, for example, laser diodes. The semiconductor laser elements 14 have oscillation wavelengths different from each other. Light emergent from the plurality of semiconductor laser elements 14 are combined in the optical coupler 16. The optical coupler 16 causes one of two lights of the same wavelength to enter the first amplifier 18 and causes the other of the two lights to enter the second amplifier 20. Each of the first amplifier 18 and the second amplifier 20 is constituted, for example, by a semiconductor optical amplifier (SOA).

In the laser module 10, a first drive circuit 22 that supplies the first amplifier 18 with a first drive current on which a dither signal is superimposed is provided. The optical amplification factor of the first amplifier 18 is increased if the first drive current is increased. A first monitoring circuit 24 that detects the current supplied to the first amplifier 18 is provided between the first drive circuit 22 and the first amplifier 18.

In the laser module 10, a second drive circuit 26 that supplies the second amplifier 20 with a second drive current is provided. The optical amplification factor of the second amplifier 20 is increased if the second drive current is increased. A second monitoring circuit 28 that detects the second drive current is provided between the second drive circuit 26 and the second amplifier 20.

The light output from the first amplifier 18 is referred to as first output light, and the light output from the second amplifier 20 is referred to as second output light. A collimator lens 30 is provided at a position at which the first output light and the second output light are incident on the collimator lens 30. A beam splitter 32 is provided in a stage subsequent to the collimator lens 30. A collective lens 34 is provided in a stage subsequent to the beam splitter 32. Light having passed through the collective lens 34 is coupled to a fiber 36.

A light receiving element 40 is provided at a position at which it receives light separated by the beam splitter 32. The light receiving element 40 receives part of the first output light and the second output light. The light receiving element 40 is, for example, a photodiode. An optical output monitoring circuit 42 that detects the intensity of light received by the light receiving element 40 is connected to the light receiving element 40.

A processing circuit 50 that controls the first drive circuit 22 and the second drive circuit 26 is provided in the package 11. The processing circuit 50 is, for example, a microcomputer. The processing circuit 50 includes a receiver 50a, a processor 50b, a memory 50c, and a transmitter 50d.

The operation of the laser module 10 will be described. A voltage is first applied to one of the plurality of laser elements 14. Output light from the laser element 14 is input to the optical coupler 16. The optical coupler 16 causes one of two lights of the same wavelength to enter the first amplifier 18 and causes the other of the two lights to enter the second amplifier 20. The first amplifier 18 amplifies the light by the "first drive current on which a dither signal is superimposed", which is supplied from the first drive circuit 22. The second amplifier 20 amplifies the light by the "second drive current" supplied from the second drive circuit 26. The first output light is output from the first amplifier 18, while the second output light is output from the second amplifier 20. Thus, the two lights are output from the light source device 12.

The first output light and the second output light are formed into parallel beams by the collimator lens 30 to enter the beam splitter 32. Most of the first output light and the second output light pass through the beam splitter 32 to be coupled to the fiber 36 via the collective lens 34. Part of the first output light and the second output light are bent by the beam splitter 32 and enter the light receiving element 40. The intensity of light received by the light receiving element 40 is detected by the optical output monitoring circuit 42.

Figure 2:
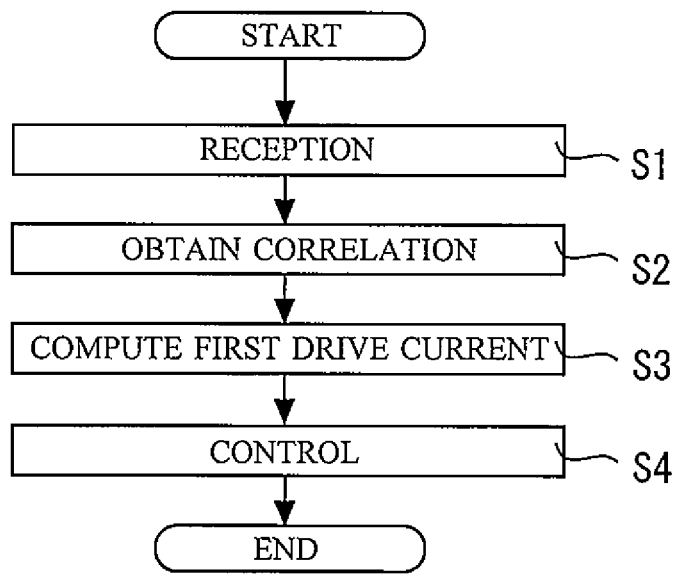
FIG. 2 is flowchart showing the operation of the processing circuit.

The processing circuit 50 determines the first drive current and the second drive current by which the intensity of the first output light and the intensity of the second output light are made constant. The operation of the processing circuit 50 will be described. FIG. 2 is a flowchart showing the operation of the processing circuit 50. The processing circuit 50 first receives by the receiver 50a the output from the first monitoring circuit 24 and the output from the optical output monitoring circuit 42 (step S1).

Figure 3:
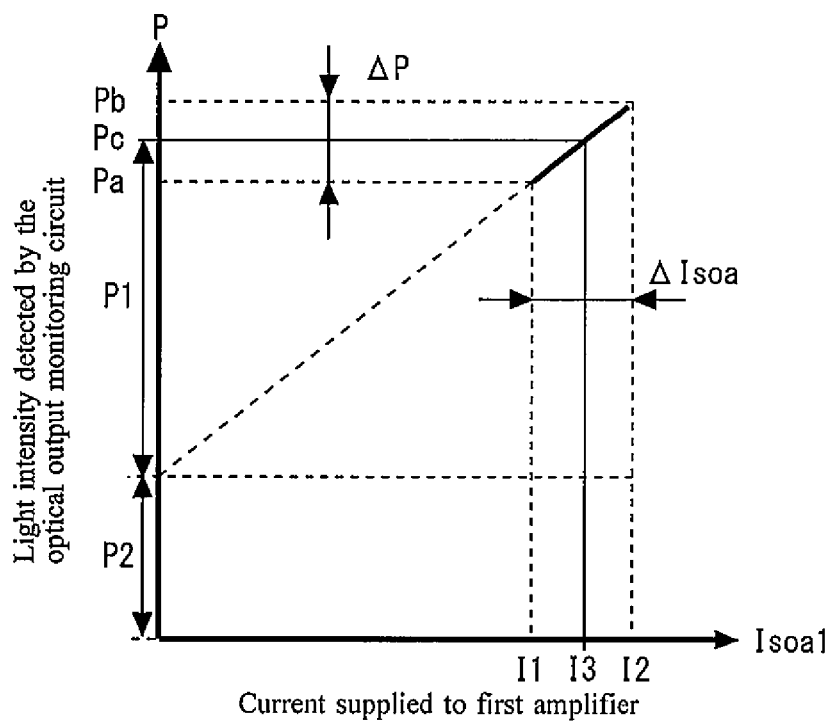
FIG. 3 is a graph showing a correlation between the first drive current and the intensity of the first output light.

Subsequently, a correlation between the first drive current and the intensity of the first output light is obtained from the output from the first monitoring circuit 24 and the output from the optical output monitoring circuit 42 (step S2). FIG. 3 is a graph showing a correlation between the first drive current and the intensity of the first output light. In FIG. 3, the abscissa represents the current Isoa1 supplied to the first amplifier 18 and the ordinate represents the light intensity P detected by the optical output monitoring circuit 42. The light intensity P is the sum of the intensity (P1) of the first output light and the intensity (P2) of the second output light.

The change in Isoa1 with respect to time due to the superimposition of the dither signal on the first drive current is ΔIsoa. The minimum of Isoa1 is I1, the maximum of Isoa1 is I2, and the average of Isoa1 is I3. The light intensity detected by the optical output monitoring circuit 42 changes by ΔP with respect to time with the change in Isoa1 with respect to time. The minimum of P is Pa, the maximum of P is Pb, and the average of P is Pc. Since the dither signal is superimposed only on the first drive current, ΔP represents the change in the first output light with respect to time. Accordingly, the gradient of a straight line in FIG. 3 represents the correlation between the first drive current and the intensity of the first output light.

The processing circuit 50 (processor 50b) computes from this correlation the first drive current by which the average of the first output light is made equal to a predetermined value (step S3). The predetermined average of the first output light is referred to as a first target intensity Px. The first target intensity Px is stored in advance in the memory 50c and used at the time of computation of the first drive current. The computed first drive current is supplied to the first drive circuit 22 (step S4). Referring to FIG. 3, the gradient η of the straight line representing the correlation can be obtained by dividing ΔP by ΔIsoa. The first drive current obtained by first target intensity Px/gradient η1 (the term on the right-hand side of the "/" is a denominator and the term on the left-hand side is a numerator) is then applied to the first amplifier 18. The intensity of the first output light (the average of the intensity) can thus be made equal to the predetermined value (first target intensity Px).

Further, in step S4, the processing circuit 50 causes the second drive current to be supplied to the second drive circuit 26 so that the average of the output from the optical output monitoring circuit 42 is constant. Since the intensity of the first output light is being controlled by the above-described means so as to be constant, the intensity of the second output light can be made constant by making constant the average of the output from the optical output monitoring circuit 42. The intensity of the first output light and the intensity of the second output light can be maintained at the predetermined values by periodically performing the processing shown in FIG. 2. The dither signal may be superimposed on the first drive current at all times or may be superimposed only when the processing shown in FIG. 2 is performed, In the laser module 10 according to the first embodiment of the present invention, as described above, the current injected into the first amplifier 18 is slightly changed by means of the dither signal and the change in the output from the first amplifier 18 is detected, thereby obtaining the correlation between the first drive current and the intensity of the first output light (the inclination or efficiency). From this correlation, the first drive current for obtaining the first target intensity Px is computed and the first amplifier 18 is driven by the computed first drive current, thereby controlling the optical output so that the optical output is constant. Accordingly, even if the correlation (gradient) is changed by degradation with time, the first drive current and the second drive current are modified according to the change, thus constantly maintaining each of the first output light and the second output light.

The processing with the above-described processing circuit 50 is realized by executing a program stored in the memory 50c. A plurality of processing circuits may cooperate with each other to perform the above-described function.

In a case where coherent optical communication is performed with the laser module 10, one of the first output light and the second output light is a signal light while the other of the first output light and the second output light is local light to be used for detection on the receiving side. The laser module 10 according to the first embodiment of the present invention is capable of making the two optical outputs constant either when using the first output light as transmission light and using the second output light as local light or when using the second output light as transmission light and using the first output light as local light.

It is preferable to set the frequency of the dither signal equal to or lower than 100 kHz and set the amplitude of the dither signal equal to or smaller than 0.2 dB with respect to the amplitude of the first drive current in order to limit the influence of the dither signal on the quality of the main signal. The amplitude of the amplifier ordinarily lowers with passage of time. In such a case, the processing circuit 50 increases the first drive current and the second drive current with passage of time as a result of the above-described processing. Output control with no significant error can be achieved by setting the processing circuit 50 such that the first drive current and the second drive current can only be increased with passage of time and cannot be reduced with passage of time.

The laser module 10 according to the first embodiment of the present invention obtains the above-described correlation by superimposing a dither signal on the first drive current in a situation where the laser module 10 has only one optical output monitoring circuit 42, and controls each of the first amplifier 18 and the second amplifier 20. While the described correlation is the gradient in the case where the abscissa represents the current supplied to the first amplifier 18 and the ordinate represents the first output light, a correlation in a different form may suffice. For example, light intensities detected by the optical output monitoring circuit 42 with respect to different values of the varying current Isoa1 may be stored in the form of a table and the table may be used as a correlation. Other various modifications can be made without losing the features of the present invention.

The above-described modifications can also be applied to laser modules according to embodiments described below. Each of the laser modules according to the embodiments described below has a number of commonalities with the first embodiment and will therefore be described mainly with respect to points of difference from the first embodiment.

Second Embodiment

Figure 4:
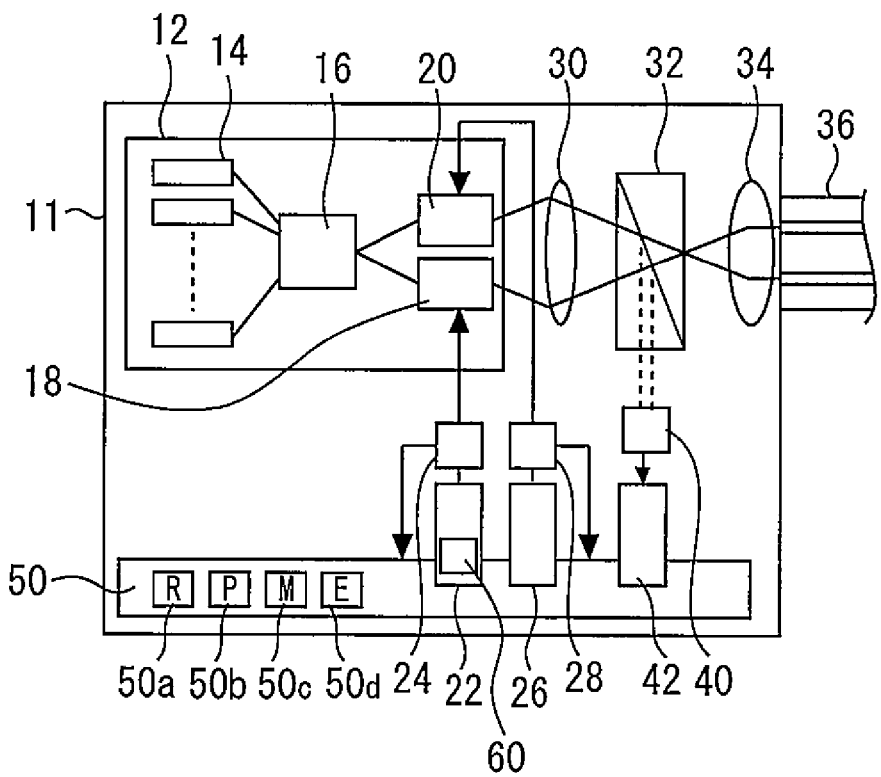
FIG. 4 is a plan view of the laser module according to the second embodiment.

FIG. 4 is a plan view of the laser module according to the second embodiment. This laser module is provided with a D/A converter 60 that generates a dither signal. The D/A converter 60 is provided in the first drive circuit 22. The first drive current is supplied via the D/A converter 60 so that the dither signal is superimposed on the first drive current.

The D/A converter 60 functions as a means for superimposing a dither signal. Use of the D/A converter 60 enables superimposition of the dither signal on the first drive current with a simple arrangement. In a case where a dither signal is superimposed on the second drive current, a D/A converter is provided in the second drive circuit 26. D/A converts may be provided both in the first drive circuit and in the second drive circuit. A dither signal may be superimposed on the first drive current by a D/A converter in the processing circuit 50.

Third Embodiment

Figure 5:
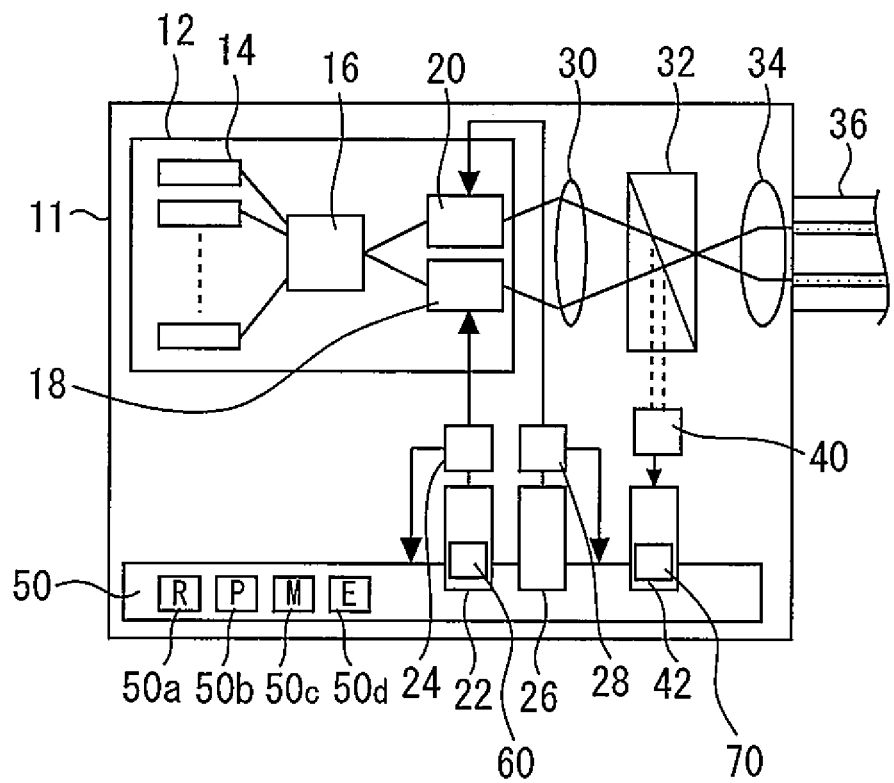
FIG. 5 is a plan view of the laser module according to the third embodiment.

FIG. 5 is a plan view of the laser module according to the third embodiment. The optical output monitoring circuit 42 is provided with an A/D converter 70 that detects vibration of the light intensity due to a dither signal. The change (ΔP) in the optical output shown in FIG. 3 corresponds to the value obtained by subtracting the minimum of the value detected by the A/D converter 70 from the maximum of this value, and Pc in FIG. 3 corresponds to the average of this value. Use of the A/D converter 70 enables detection of the vibration of the light intensity due to the dither signal with a simple arrangement. The A/D converter may alternatively be provided in the processing circuit 50.

Fourth Embodiment

Figure 6:
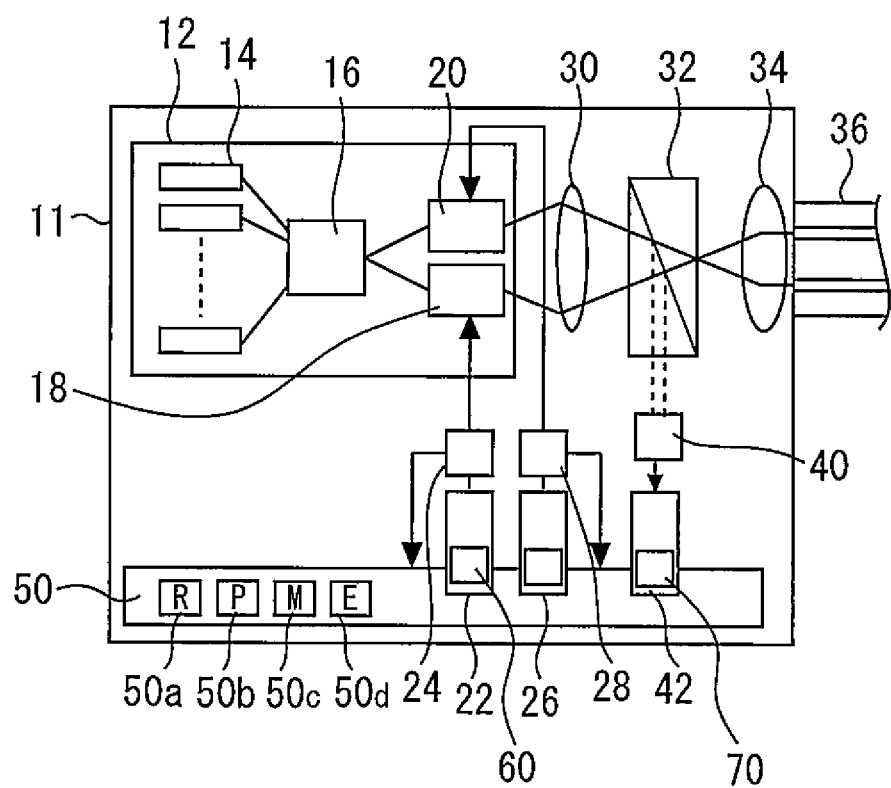
FIG. 6 is a plan view of the laser module according to the fourth embodiment.

FIG. 6 is a plan view of the laser module according to the fourth embodiment. The first drive circuit 22 supplies the first drive current to the first amplifier 18. The first monitoring circuit 24 detects the current supplied to the first amplifier 18. The second drive circuit 26 supplies the second drive current to the second amplifier 20. The second monitoring circuit 28 detects the current supplied to the second amplifier 20.

Figure 7:
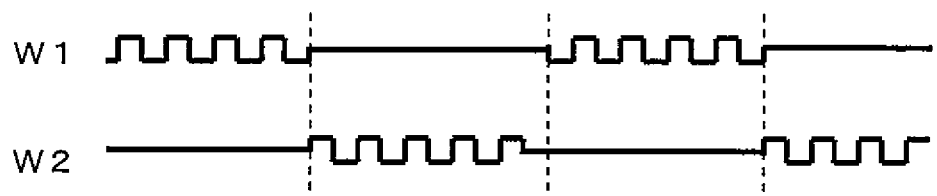
FIG. 7 is a diagram for explaining a method of superimposing the dither signal.

The processing circuit 50 causes a dither signal to be alternately superimposed on the first drive current and the second drive current. FIG. 7 is a diagram for explaining a method of superimposing the dither signal. W1 is a current waveform supplied to the first amplifier 18. W2 is a current waveform supplied to the second amplifier 20. When the waveform W1 includes the dither signal, the waveform W2 does not include the dither signal. When the waveform W2 includes the dither signal, the waveform W1 does not include the dither signal.

The processing circuit 50 obtains a first correlation as a correlation between the first drive current and the intensity of the first output light from the output from the first monitoring circuit 24 and the output from the optical output monitoring circuit 42 when the dither signal is superimposed on the first drive current.

The processing circuit 50 obtains a second correlation as a correlation between the second drive current and the intensity of the second output light from the output from the second monitoring circuit 28 and the output from the optical output monitoring circuit 42 when the dither signal is superimposed on the second drive current.

The processing circuit 50 computes from the first correlation the first drive current by which the average of the intensity of the first output light is made equal to a predetermined value, and causes the computed first drive current to be supplied to the first drive circuit 22. The processing circuit 50 also computes from the second correlation the second drive current by which the average of the intensity of the second output light is made equal to a predetermined value, and causes the computed second drive current to be supplied to the second drive circuit 26.

Figure 8:
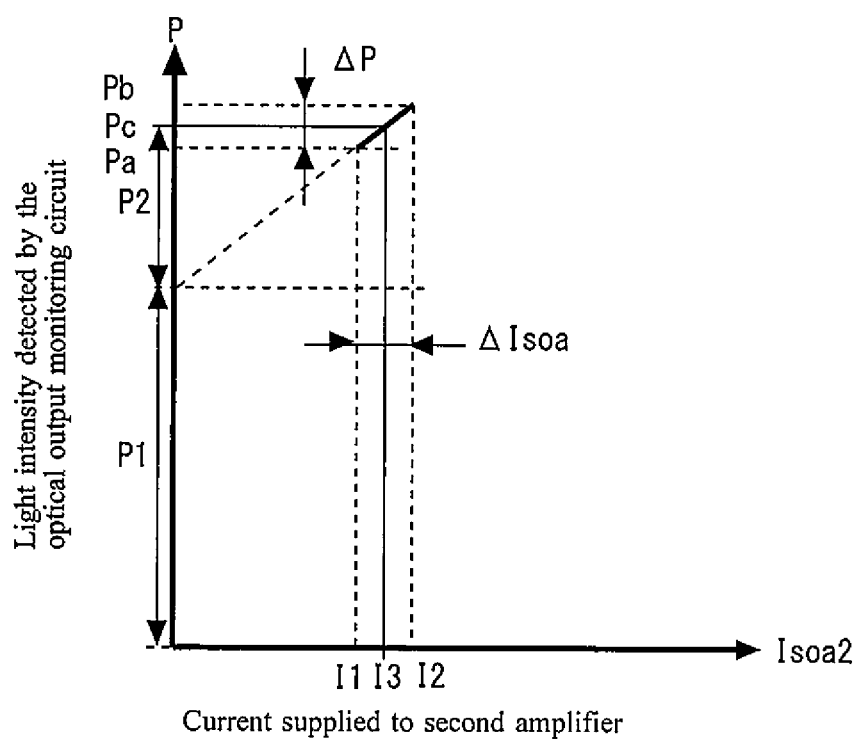
FIG. 8 is a graph for explaining a method of computing the second drive current.

In the laser module according to the fourth embodiment of the present invention, the method of computing the first drive current, described in the description of the first embodiment, is applied to computation of the second drive current by which the average of the intensity of the second output light is made equal to a predetermined value. The predetermined average of the second output light is referred to as a second target intensity Py. FIG. 8 is a graph for explaining a method of computing the second drive current. The ordinate represents the light intensity detected by the optical output monitoring circuit 42, and the abscissa represents the current Isoa2 supplied to the second amplifier 20. When the dither signal is superimposed on the second drive current, Isoa2 vibrates in a range of ΔIsoa. Accordingly, the light intensity detected by the optical output monitoring circuit 42 also vibrates in a range of ΔP. A gradient η2 can be obtained by dividing ΔP by ΔIsoa. The second drive current obtained by second target intensity Py/gradient η2 is then applied to the second amplifier 20. The intensity of the second output light (the average of the intensity) can thus be made equal to the predetermined value (first target intensity Py).

In the laser module according to the fourth embodiment of the present invention, as described above, the first correlation representing a characteristic of the first amplifier 18 and the second correlation representing a characteristic of the second amplifier 20 are obtained. From these correlations, the first drive current and the second drive current by which the first target intensity Px and the second target intensity Py are obtained are supplied. The intensity of the first output light and the intensity of the second output light can be constantly maintained by periodically performing this processing.

The method of superimposing the dither signal is not particularly specified restrictively if the time period during which the dither signal is superimposed on the first drive current and the time period during which the dither signal is superimposed on the second drive current do not overlap each other. For example, a time period during which the dither signal is superimposed neither on the first drive current nor on the second drive current may be provided. Suitable combinations of the features of the laser modules according to the embodiments described above may be made and used.

According to the present invention, a dither signal is superimposed on one of two drive currents to respectively grasp the characteristics of the two optical amplifiers. As a result, each of the optical outputs from the two optical amplifiers can be made constant with the simple arrangement.

Obviously many modifications and variations of the present invention are possible in the light of the above teachings. It is therefore to be understood that within the scope of the appended claims the invention may be practiced otherwise than as specifically described.

What is claimed is:

1. A laser module comprising:
   a light source device having a first amplifier that outputs first output light, and a second amplifier that outputs second output light;
   a first drive circuit that supplies the first amplifier with a first drive current on which a dither signal is superimposed;
   a first monitoring circuit that detects the current supplied to the first amplifier;
   a second drive circuit that supplies the second amplifier with a second drive current;
   a second monitoring circuit that detects the second drive current;
   a light receiving element that receives part of the first output light and the second output light;
   an optical output monitoring circuit that detects the intensity of the light received by the light receiving element; and
   a processing circuit that controls the first drive circuit and the second drive circuit,
   wherein the processing circuit obtains a correlation between the first drive current and the intensity of the first output light from the output from the first monitoring circuit and the output from the optical output monitoring circuit, computes from the correlation the first drive current by which the average of the first output light is made equal to a predetermined value, causes the computed first drive current to be supplied to the first drive circuit, and
   causes the second drive current to be supplied to the second drive circuit so that the average of the output from the optical output monitoring circuit is constant.

2. The laser module according to claim 1, wherein the correlation is a gradient when the abscissa represents the current supplied to the first amplifier and the ordinate represents the first output light.

3. A laser module comprising:
   a light source device having a first amplifier that outputs first output light, and a second amplifier that outputs second output light;

a first drive circuit that supplies the first amplifier with a first drive current;

a first monitoring circuit that detects the current supplied to the first amplifier;

a second drive circuit that supplies the second amplifier with a second drive current;

a second monitoring circuit that detects the current supplied to the second amplifier;

a light receiving element that receives part of the first output light and the second output light;

an optical output monitoring circuit that detects the intensity of the light received by the light receiving element; and a processing circuit that controls the first drive circuit and the second drive circuit, wherein the processing circuit causes a dither signal to be alternately superimposed on the first drive current and the second drive current;

obtains a first correlation as a correlation between the first drive current and the intensity of the first output light from the output from the first monitoring circuit and the output from the optical output monitoring circuit when the dither signal is superimposed on the first drive current;

obtains a second correlation as a correlation between the second drive current and the intensity of the second output light from the output from the second monitoring circuit and the output from the optical output monitoring circuit when the dither signal is superimposed on the second drive current;

computes from the first correlation the first drive current by which the average of the first output light is made equal to a predetermined value, and causes the computed first drive current to be supplied to the first drive circuit, and computes from the second correlation the second drive current by which the average of the second output light is made equal to a predetermined value, and causes the computed second drive current to be supplied to the second drive circuit.

4. The laser module according to claim 1, wherein the frequency of the dither signal is set equal to or lower than 100 kHz.

5. The laser module according to claim 1, wherein the amplitude of the dither signal is set equal to or smaller than 0.2 dB with respect to the amplitude of the first drive current.

6. The laser module according to claim 1, wherein the processing circuit increases the first drive current and the second drive current with passage of time.

7. The laser module according to claim 1, further comprising a D/A converter that generates the dither signal.

8. The laser module according to claim 1, wherein the optical output monitoring circuit comprises an A/D converter that detects vibration of the light intensity due to the dither signal.

9. The laser module according to claim 1, wherein the first output light is transmission light, the second output light is local light to be used for detection on the receiving side, and the laser module performs coherent optical communication.

10. The laser module according to claim 1, wherein the second output light is transmission light, the first output light is local light to be used for detection on the receiving side, and the laser module performs coherent optical communication.

* * * * *